(12) United States Patent
Karasaki et al.

(10) Patent No.: US 12,300,482 B2
(45) Date of Patent: *May 13, 2025

(54) ELEMENT CHIP MANUFACTURING METHOD AND SUBSTRATE PROCESSING METHOD

(71) Applicant: Panasonic Intellectual Property Management Co., Ltd., Osaka (JP)

(72) Inventors: Hidehiko Karasaki, Hyogo (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 435 days.

This patent is subject to a terminal disclaimer.

(21) Appl. No.: 17/663,452

(22) Filed: May 16, 2022

(65) Prior Publication Data

US 2022/0384177 A1 Dec. 1, 2022

(30) Foreign Application Priority Data

May 31, 2021 (JP) .................................. 2021-091414

(51) Int. Cl.
*H01L 21/02* (2006.01)
*H01L 21/463* (2006.01)
(Continued)

(52) U.S. Cl.
CPC ...... *H01L 21/02019* (2013.01); *H01L 21/463* (2013.01); *H01L 21/68* (2013.01);
(Continued)

(58) Field of Classification Search
CPC ......... H01L 23/544; H01L 2223/54426; H01L 2223/54453; H01L 21/782
See application file for complete search history.

(56) References Cited

U.S. PATENT DOCUMENTS 8,642,448 B2 * 2/2014 Lei .................... H01L 21/67069
438/462
11,289,428 B2 * 3/2022 Arita ...................... B23K 26/18
(Continued)

FOREIGN PATENT DOCUMENTS

JP 2013-535114 A 9/2013
WO 2011/163149 A2 12/2011

*Primary Examiner* — David A Zarneke
(74) *Attorney, Agent, or Firm* — MCDONALD HOPKINS LLC

(57) ABSTRACT

A method including: a step of preparing a substrate that includes a first layer having a first principal surface provided with a dicing region, and a mark, and a second principal surface, and includes a semiconductor layer; a step of covering a first region corresponding to the mark on the second principal surface, with a resist film; a step of forming a metal film on the second principal surface; a step of removing the resist film, to expose the semiconductor layer corresponding to the first region; a step of imaging the substrate, with a camera, to detect a position of the mark through the semiconductor layer, and calculating a second region corresponding to the dicing region on a surface of the metal film; and a step of irradiating a laser beam to the second region, to remove the metal film and expose the semiconductor layer corresponding to the second region.

5 Claims, 17 Drawing Sheets

(51) Int. Cl.
   *H01L 21/68* (2006.01)
   *H01L 23/544* (2006.01)
(52) U.S. Cl.
   CPC .. *H01L 23/544* (2013.01); *H01L 2223/54426* (2013.01); *H01L 2223/54453* (2013.01)

(56) References Cited

U.S. PATENT DOCUMENTS

| | | | |
|---|---|---|---|
| 2004/0002199 A1* | 1/2004 | Fukuyo | C03B 33/023 438/106 |
| 2006/0138681 A1 | 6/2006 | Best et al. | |
| 2011/0215442 A1 | 9/2011 | Shneyder et al. | |
| 2013/0321811 A1* | 12/2013 | Maeda | G03F 9/7084 356/400 |
| 2020/0381367 A1 | 12/2020 | Arita et al. | |
| 2022/0367273 A1* | 11/2022 | Karasaki | H01L 21/78 |

* cited by examiner

ELEMENT CHIP MANUFACTURING METHOD AND SUBSTRATE PROCESSING METHOD

CROSS REFERENCE TO RELATED APPLICATION

The present application is based on and claims priority under 35 U.S.C. § 119 with respect to the Japanese Patent Application No. 2021-091414 filed on May 31, 2021, of which entire content is incorporated herein by reference into the present application.

TECHNICAL FIELD

The present disclosure relates to an element chip manufacturing method and a substrate processing method.

BACKGROUND

Element chips are usually manufactured by dicing a substrate including a semiconductor layer and the like. The substrate includes a plurality of element regions and a dicing region that defines the element regions. The substrate is diced by removing the semiconductor layer along the dicing region, into a plurality of element chips. Patent Literature 1 (JP 2013-535114) teaches to form groove-like gaps along the dicing region called streets by irradiation with laser beam, and then to expose the semiconductor layer to plasma, thereby to etch the semiconductor layer exposed from the gaps, and thus to dice the substrate.

With increasing technological development of electric vehicles (EVs) and the like, the demand for element chips called power devices has been increasing. Power devices, such as power MOSFET, are used mainly for power conversion and are required to be highly resistant to pressure and heat. To meet such requirements, devices that require heat dissipation therefrom represented by power devices are in some cases configured to allow current to flow in the thickness direction and include a metal film provided on the back surface side. Such element chips are obtained, for example, by dicing a substrate including a metal film and a semiconductor layer. However, especially when the metal film contains a high melting point metal, which is poor in reactivity, it is difficult to etch the metal film with plasma.

SUMMARY

One aspect of the present disclosure relates to an element chip manufacturing method, including: a preparation step of preparing a semiconductor substrate that includes a first layer having a first principal surface provided with a plurality of element regions, a dicing region defining the element regions, and an alignment mark, and having a second principal surface opposite the first principal surface, wherein the first layer includes a semiconductor layer; a covering step of covering a first region that corresponds to the alignment mark on the second principal surface, with a resist film; a metal film formation step of forming a metal film on the second principal surface; a first exposure step of removing the resist film, to expose the semiconductor layer corresponding to the first region; a calculation step of imaging the semiconductor substrate from a surface side of the metal film, with a camera capable of sensing electromagnetic waves passing through the semiconductor layer, to detect a position of the alignment mark through the semiconductor layer corresponding to the first region, and then calculating a second region that corresponds to the dicing region on a surface of the metal film, based on the detected position of the alignment mark; a second exposure step of irradiating a first laser beam to the second region from the surface side of the metal film, to remove the metal film corresponding to the second region and expose the semiconductor layer corresponding to the second region; and a dicing step of removing the exposed semiconductor layer corresponding to the second region, after the second exposure step, to dice the semiconductor substrate into a plurality of element chips.

Another aspect of the present disclosure relates to a substrate processing method, including: a preparation step of preparing a semiconductor substrate that includes a first layer having a first principal surface provided with a plurality of element regions, a dicing region defining the element regions, and an alignment mark, and having a second principal surface opposite the first principal surface, wherein the first layer includes a semiconductor layer; a covering step of covering a first region that corresponds to the alignment mark on the second principal surface, with a resist film; a metal film formation step of forming a metal film on the second principal surface; a first exposure step of removing the resist film, to expose the semiconductor layer corresponding to the first region; a calculation step of imaging the semiconductor substrate from a surface side of the metal film, with a camera capable of sensing electromagnetic waves passing through the semiconductor layer, to detect a position of the alignment mark through the semiconductor layer corresponding to the first region, and then calculating a second region that corresponds to the dicing region on a surface of the metal film, based on the detected position of the alignment mark; a second exposure step of irradiating a first laser beam to the second region from the surface side of the metal film, to remove the metal film corresponding to the second region and expose the semiconductor layer corresponding to the second region; and an etching step of etching with plasma the exposed semiconductor layer corresponding to the second region, after the second exposure step.

According to the present disclosure, a semiconductor substrate including a metal film can be diced or etched with high precision.

DETAILED DESCRIPTION

Figure 1:
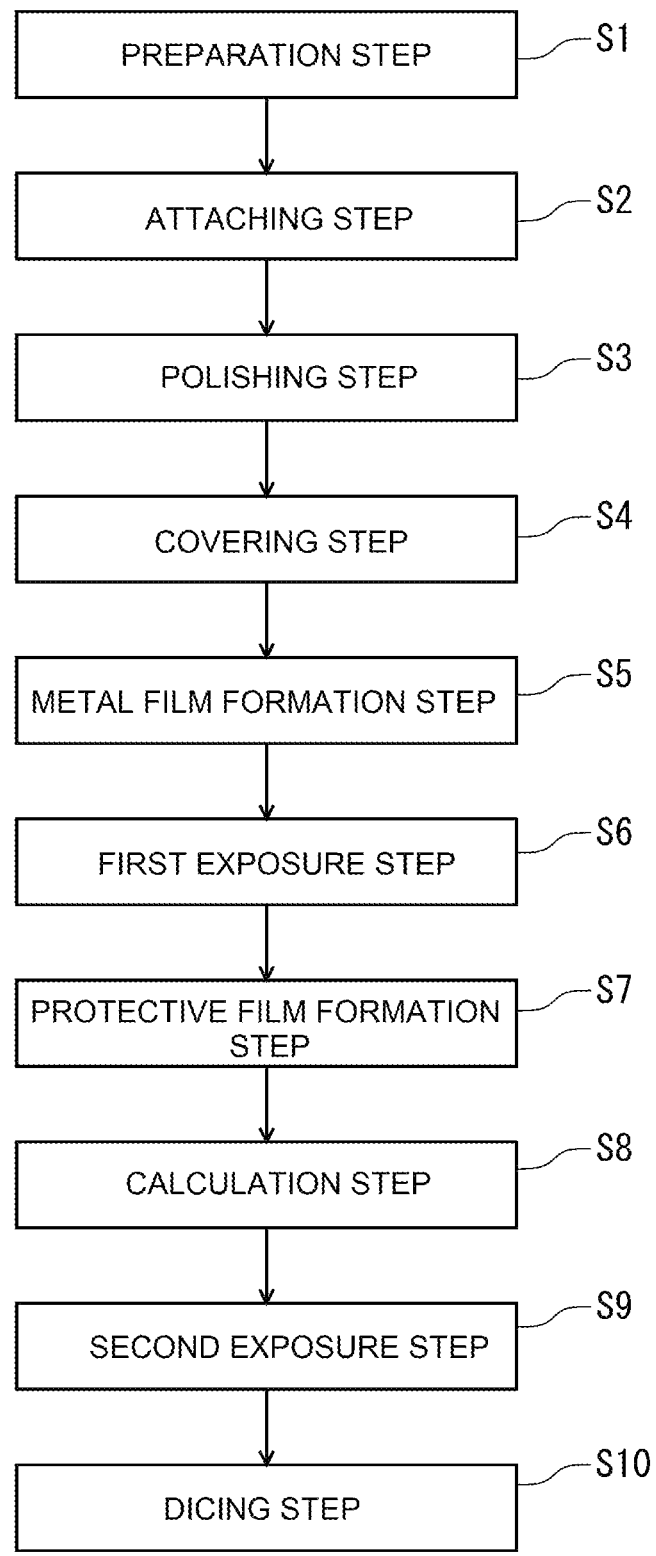
FIG. 1 is a flowchart of an element chip manufacturing method according to an embodiment of the present disclosure.

A description will be given below of an embodiment of an element chip manufacturing method and a substrate processing method according to the present disclosure, by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

(Element Chip Manufacturing Method)

An element chip manufacturing method according to the present disclosure includes a preparation step, a covering step, a metal film formation step, a first exposure step, a calculation step, a second exposure step, and a dicing step.

In the preparation step, a semiconductor substrate is prepared which includes a first layer including a semiconductor layer. The first layer has a first principal surface provided with a plurality of element regions, dicing regions defining the element regions, and an alignment mark, and a second principal surface opposite the first principal surface. Here, the alignment mark is a mark that indicates the dicing regions or is provided for positioning.

In the covering step, the first region is covered with a resist film. Here, the first region refers to a region that corresponds to the alignment mark on the second principal surface of the first layer (e.g., a region on the back side of the alignment mark). The resist film may be made of any resist material. The area of the front surface of the resist film may be larger than that of the back surface thereof, and in this case, the width of the resist film may be narrowed from the front surface side toward the back surface side. The cross-sectional area of the resist film of the cross section orthogonal to the thickness direction may be the largest at the front surface. Without limited thereto, the width of the resist film may be substantially consistent from the front surface to the back surface.

In the metal film formation step, a metal film is formed on the second principal surface of the first layer. In the metal film formation step, the metal film is not formed on a region (first region) covered with the resist film of the second principal surface. The metal film may be formed by, for example, vapor deposition or sputtering. The metal film may also be formed on the resist film. Examples of the material of the metal film include silver, copper, aluminum, an aluminum alloy, tungsten, nickel, gold, platinum, and titanium.

In the first exposure step, the resist film is removed, to expose the semiconductor layer corresponding to the first region. The resist film may be removed by bringing the semiconductor substrate into contact with a chemical solution that dissolves the resist film. When the metal film is also formed on the resist film, the metal film on the resist film can be removed, along with removing the resist film.

In the calculation step, a position of the alignment mark is detected, and a second region that corresponds to the dicing regions on the surface of the metal film is calculated, based on the detected position of the alignment mark. The detection of the position of the alignment mark can be done by imaging the semiconductor substrate, with a camera capable of sensing electromagnetic waves passing through the semiconductor layer. In this way, the alignment mark can be detected from the surface side of the metal film. For example, when the semiconductor layer is made of silicon, the electromagnetic waves that pass through the semiconductor layer may have a wavelength of 1100 nm or more and 6 μm or less.

In the second exposure step, a first laser beam is irradiated to the second region from the surface side of the metal film, to remove the metal film corresponding to the second region and expose the semiconductor layer corresponding to the second region. The first laser beam may be a laser beam that is absorbed into the metal film. The first laser beam may be a laser beam that passes through the semiconductor layer.

In the dicing step, after the second exposure step, the exposed semiconductor layer corresponding to the second region is removed, to dice the semiconductor substrate into a plurality of element chips. The semiconductor layer may be removed, for example, by exposure to plasma.

As described above, in the metal film formation step, the metal film is not formed in the region (first region) covered with the resist film of the second principal surface. This means that, in the first region, although it is necessary to remove the resist film from the second principal surface in order to enable the position of the alignment mark to be detected with the camera, it is not necessary to remove the metal film from the second principal surface. The damage to the second principal surface is smaller when the resist film is removed from the second principal surface than when the metal film is removed therefrom. Therefore, the smoothness of the first region on the second principal surface is less likely to be impaired, and the electromagnetic waves passing through the semiconductor layer corresponding to the first region are less likely to be scattered. Thus, the alignment mark can be clearly imaged by the camera capable of sensing those electromagnetic waves, and the position of the alignment mark can be accurately detected. Once the position of the alignment mark can be accurately detected, the subsequent steps, i.e., the calculation of the second region, the exposure of the semiconductor layer corresponding to the second region, and the dicing of the semiconductor substrate, can be performed with high precision.

The element chip manufacturing method may further include a protective film formation step of forming a protective film covering the surface of the metal film, before the second exposure step. In this case, in the second exposure step, the protective film corresponding to the second region may be removed together with the metal film corresponding to the second region, and in the dicing step, the semiconductor layer corresponding to the second region may be removed by exposing the second region to plasma. According to this configuration, in the dicing step involving plasma irradiation, the metal film can be protected by the protective film from plasma and debris.

The element chip manufacturing method may further include an attaching step of attaching the first principal surface of the semiconductor substrate onto a holding sheet, before the dicing step. Furthermore, the dicing step may be performed while the semiconductor substrate is held by the holding sheet. According to this configuration, the ease of handling of the semiconductor substrate can be increased. In addition, it is possible to hold a plurality of element chips formed in the dicing step with a holding sheet. The attaching step may be performed before the dicing step, but is desirably performed, for example, before the calculation step. The attaching step may be performed before or after the first exposure step. In the case of performing after the first exposure step, even when a solution that dissolves the resist film is used in the first exposure step, it is possible to prevent the solution from adhering to the holding sheet.

The element chip manufacturing method may further include a polishing step of polishing the second principal surface of the semiconductor substrate, before the covering step. This improves the smoothness of the second principal surface including the first region, which can further suppress the scattering of the electromagnetic waves passing through the semiconductor layer corresponding to the first region.

(Substrate Processing Method)

A substrate processing method according to the present disclosure includes a preparation step, a covering step, a metal film formation step, a first exposure step, a calculation step, a second exposure step, and an etching step.

The preparation step, the covering step, the metal film formation step, the first exposure step, the calculation step, and the second exposure step may be the same as those in the above-described element chip manufacturing method.

In the etching step, after the second exposure step, the exposed semiconductor layer corresponding to the second region is etched with plasma. By this etching, grooves are formed in the semiconductor layer along the dicing regions. Similar to in the above-described element chip manufacturing method, plasma etching of the semiconductor layer can be performed with high precision.

As described above, according to the present disclosure, a semiconductor substrate having a metal film can be diced or etched with high precision.

In the following, examples of the element chip manufacturing method and the substrate processing method according to the present disclosure will be specifically described with reference to the drawings. The steps as described above can be applied to the steps of the below-described examples of the element chip manufacturing method and the substrate processing method. The steps of the below-described examples of the element chip manufacturing method and the substrate processing method can be modified based on the description above. The matters as described below may be applied to the above embodiments. Of the steps of the below-described examples of the element chip manufacturing method and the substrate processing method, the steps which are not essential to the element chip manufacturing method and the substrate processing method according to the present disclosure may be omitted. The figures below are schematic and not intended to correctly reflect the shape and the number of the actual members.

FIG. 1 is a flowchart of an element chip manufacturing method according to the present embodiment.

(1) Preparation Step (S1)

First, a semiconductor substrate subjected to dicing is prepared.

(Semiconductor Substrate)

The semiconductor substrate includes a first layer having a first principal surface provided with a plurality of element regions, dicing regions defining the element regions, and an alignment mark, and a second principal surface opposite the first principal surface. The first layer includes a semiconductor layer.

The first layer may further include a wiring layer and an electrically insulating film on the first principal surface side. In this case, the semiconductor substrate corresponding to the element regions includes, for example, the wiring layer and the semiconductor layer. The semiconductor substrate corresponding to the dicing regions includes, for example, the insulating film and the semiconductor layer. The insulating film may contain a metal material, such as TEG (Test Element Group). Etching the semiconductor substrate in its thickness direction along the dicing regions can provide a plurality of element chips.

The semiconductor substrate may be of any size, and is, for example, about 50 mm or more and 300 mm or less in maximum diameter. The semiconductor substrate may be of any shape, and is, for example, circular, rectangular, or hexagonal. The semiconductor substrate may be provided with a cut, such as an orientation flat or a notch.

The semiconductor layer contains, for example, silicon (Si), gallium arsenide (GaAs), gallium nitride (GaN), or silicon carbide (SiC). The semiconductor layer in the element chip may have any thickness; the thickness may be, for example, 20 µm or more and 1000 µm or less, and may be 100 µm or more and 300 µm or less.

The wiring layer constitutes, for example, a semiconductor circuit, an electronic component element, or MEMS, and may include an electrically insulating film, a metal material, a resin layer (e.g., polyimide), a resist layer, an electrode pad, a bump, and others. The insulating film may be in the form of a laminate with a wiring metal material (multi-layer wiring layer or redistribution layer).

The shape of each dicing region may be set as appropriate according to a desired shape of element chips, without limited to a straight line shape, and may be, for example, a zig-zag shape or a wavy line shape. Note that the shape of element chips is, for example, rectangular or hexagonal.

The width of each dicing region may be set as appropriate depending on the size of the semiconductor substrate or the element chips, and others. The width of each dicing region is, for example, 10 µm or more and 300 µm or less. A plurality of the dicing regions may have the same width or different widths. Typically, a plurality of the dicing regions are formed on the semiconductor substrate. The pitch between the dicing regions adjacent to each other also is not limited, and may be set as appropriate depending on the size of the semiconductor substrate or the element chips, and others.

The alignment mark is provided on the first principal surface, for positioning of the semiconductor substrate. The alignment mark is not limited, but may be a mark indicating the boundaries between the dicing regions and the element regions (e.g., a metal pattern called a seal or seal ring, a pattern formed of an electrically insulating material called a scribe line), and may be a mark especially provided for positioning. The alignment mark can be usually distinguished from the semiconductor layer and the wiring layer by image recognition. The alignment mark may be of any shape. The shape of the alignment mark may be a combination of straight lines (e.g., parallel lines, grid pattern lines), and may be, for example, a cross shape, a circle shape, or a rectangle shape. The alignment mark other than the boundary line is provided, for example, in an outer peripheral portion of the semiconductor substrate within the dicing regions. The alignment mark may be provided somewhere in the element regions, as needed.

Figure 2A:
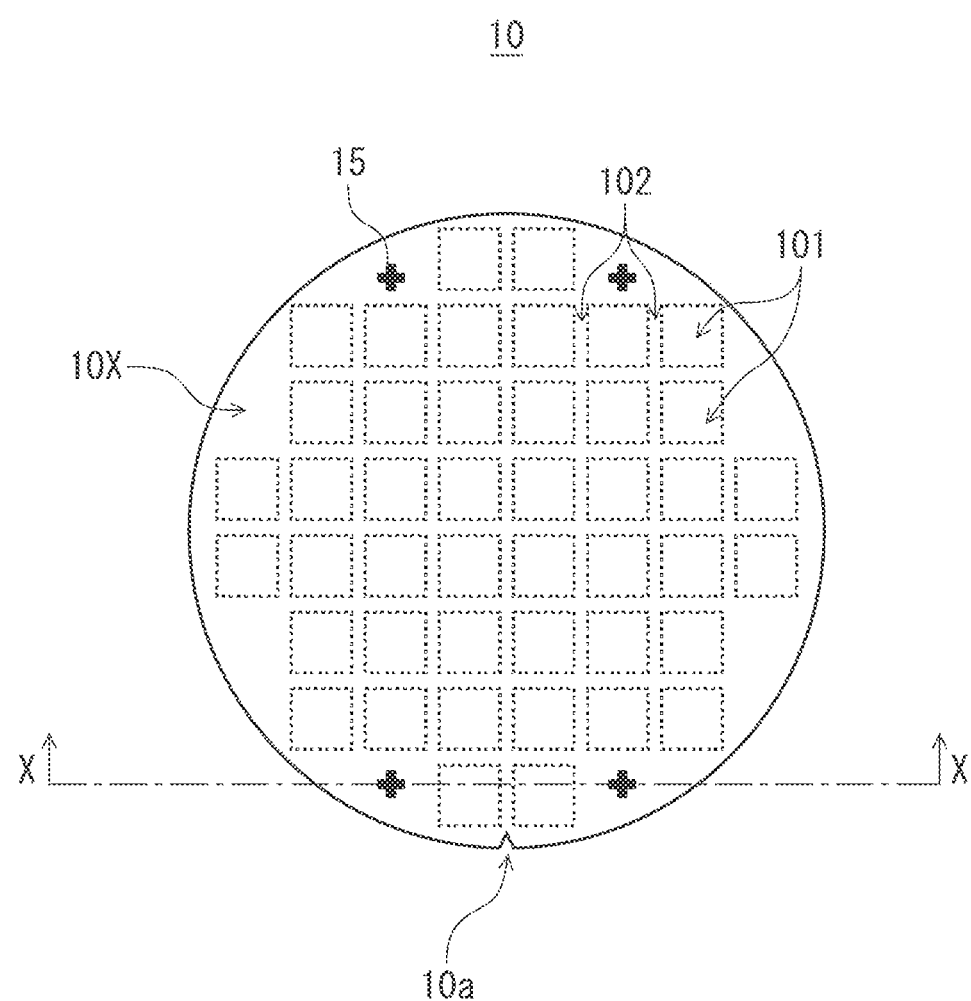
FIG. 2A is a schematic top view of a semiconductor substrate according to an embodiment of the present disclosure.
Figure 2B:
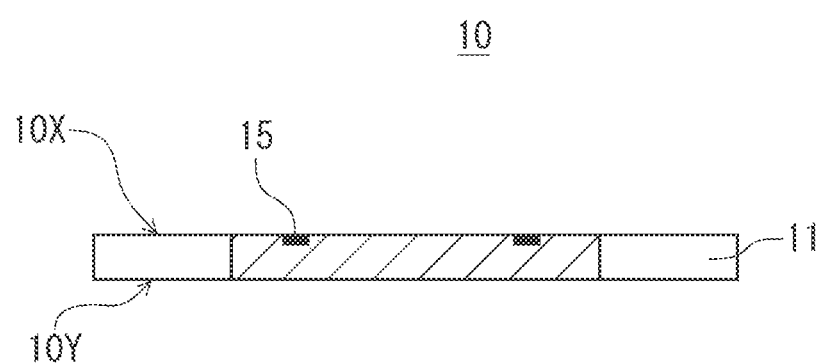
FIG. 2B is a cross-sectional view of the semiconductor substrate of FIG. 2A taken along a line X-X.

FIG. 2A is a schematic top view of a semiconductor substrate seen from the first principal surface side. FIG. 2B is a cross-sectional view of the semiconductor substrate of FIG. 2A taken along the line X-X.

A semiconductor substrate 10 includes: a first layer having a first principal surface 10X provided with a plurality of element regions 101, dicing regions 102 defining the element regions 101, and an alignment mark 15, and a second principal surface 10Y opposite the first principal surface 10X. The first layer includes a semiconductor layer 11. On the outer periphery of the first principal surface 10X, four alignment marks 15 each having a cross shape are provided. The semiconductor substrate 10 has one notch 10a.

(2) Attaching Step (S2)

After the preparation step and before the dicing step (in this example, before the polishing step), the semiconductor substrate may be attached at the first principal surface to a holding sheet. This increases the ease of handling of the semiconductor substrate.

(Holding Sheet)

The holding sheet may be secured to a frame. This can further increase the ease of handling. The semiconductor substrate is subjected to each step, for example, in a state of being held by a conveying carrier including a frame and a holding sheet secured to the frame.

The frame is a frame member having an opening equal to or greater in area than the whole semiconductor substrate, and has a predetermined width and a substantially consistent thin thickness. The frame has such a rigidity that it can be conveyed with the holding sheet and the semiconductor substrate held thereon. The opening of the frame may be of any shape, for example, a circular shape or a polygonal shape, such as a rectangular or hexagonal shape. The frame may be made of, for example, a metal, such as aluminum or stainless steel, or a resin.

The holding sheet may be made of any material. For easy attachment of the semiconductor substrate thereto, the holding sheet preferably includes an adhesive layer and a non-adhesive layer with flexibility.

The non-adhesive layer may be made of any material, for example, polyolefin such as polyethylene and polypropylene, polyester such as polyvinyl chloride and polyethylene terephthalate, and other thermoplastic resins. The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover the opening of the frame. On the adhesive side exposed from the opening of the frame, the semiconductor substrate is attached, with one of its principal surfaces (first principal surface) in contact with the adhesive side. The semiconductor substrate is thus held on the holding sheet. The semiconductor substrate may be held on the holding sheet via a die attach film (DAF).

The adhesive layer is preferably made of an adhesive component, the adhesive strength of which is reduced by ultraviolet (UV) irradiation. In picking up the element chips after dicing, the element chips can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less (preferably 5 μm or more and 15 μm or less).

Figure 3:
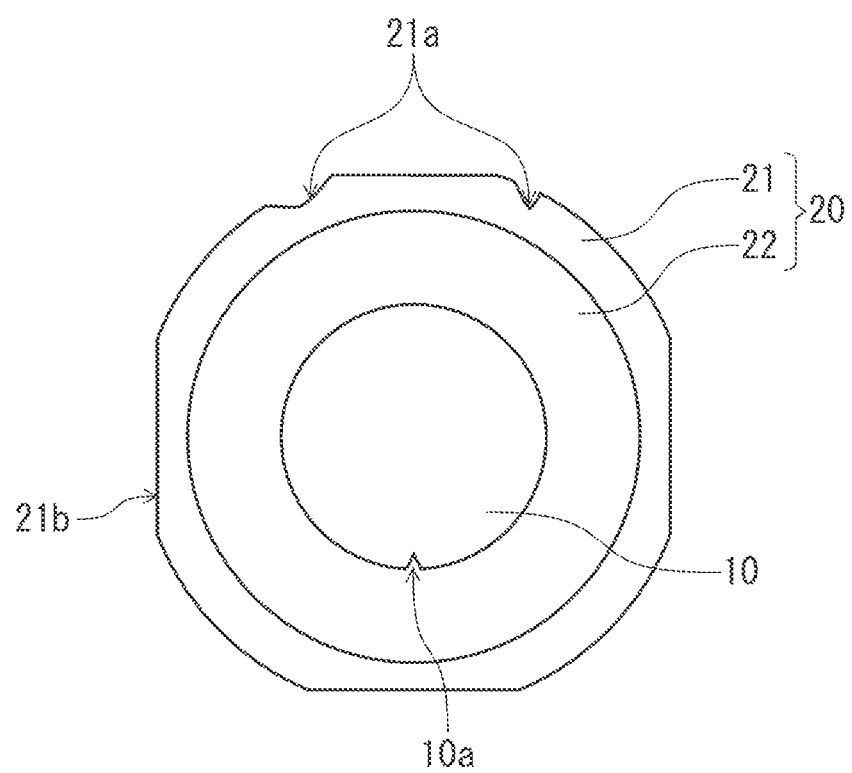
FIG. 3 is a schematic top view of a conveying carrier and the semiconductor substrate held thereon.
Figure 4:
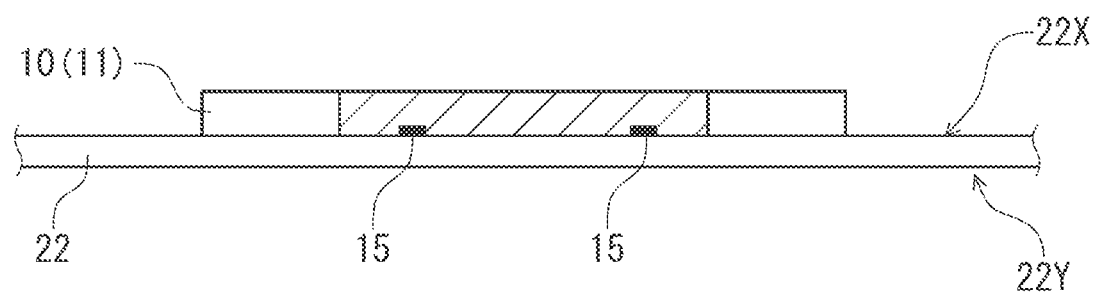
FIG. 4 is a cross-sectional view taken along the line X-X in FIG. 2A of the semiconductor substrate after an attaching step according to an embodiment of the present disclosure.

FIG. 3 is a schematic top plan view of the conveying carrier and the semiconductor substrate held thereon. FIG. 4 is a cross-sectional view taken along the line X-X in FIG. 2A of the semiconductor substrate after the attaching step according to the present embodiment. A conveying carrier 20 includes a frame 21 and a holding sheet 22 secured to the frame 21. The frame 21 may be provided with a notch 21a and a corner cut 21b for correct positioning. An adhesive side 22X of the holding sheet 22 is attached at its periphery to one side of the frame 21, and on the adhesive side 22X exposed from the opening of the frame 21, one of the principal surfaces of the semiconductor substrate 10 is attached. In plasma processing, the holding sheet 22 is placed on a stage in a plasma processing apparatus, such that a non-adhesive side 22Y opposite the adhesive side 22X comes in contact with the stage.

(3) Polishing Step (S3)

Prior to the covering step, the second principal surface of the semiconductor substrate may be polished. This improves the smoothness of the second principal surface. Furthermore, in this polishing step, the semiconductor substrate may be thinned to a desired thickness.

(4) Covering Step (S4)

The first region that corresponds to the alignment mark on the second principal surface is covered with a resist film.

The resist film includes a resist material. The resist material may be contained in a liquid resist solution or may be a dry film resist. The resist material may be, for example, a photoresist. The photoresist includes, for example, a resist resin, a photosensitive agent, an additive, and the like. The resist resin is not limited, but may be, for example, a novolak-type resin (e.g., phenol novolak resin). The photosensitive agent may be, for example, an acid generating agent that generates an organic acid with strong acidity, upon irradiation with light. The resist film may be of positive type or negative type, but preferred is a negative resist because it is easy to adjust the cross-sectional shape of the patterned resist film by adjusting the exposure amount. The resist resin may be a water-soluble resin. The resist film may have any thickness, but in order to facilitate the removal (lift-off) of the metal film in the first exposure step (S6) as described later, preferably has a thickness thicker than that of the metal film formed in the metal film formation step (S5) as described later.

The resist film may be formed by any method, for example, by applying a resist solution or by laminating a dry film resist using a laminating machine. The resist solution includes, for example, a resist material and a solvent. The solvent is not limited, but may be, for example, methyl ethyl ketone, propylene glycol monomethyl ether acetate, and the like. For example, applying a resist solution onto the second principal surface, to form an applied film and then dry the applied film can form a resist film. The temperature of heating to dry the applied film may be 50° C. or higher, may be 60° C. or higher, and may be 90° C. or higher.

The formation of an applied film on the second principal surface (the application of a resist solution onto the second principal surface) may be done by any technique, as long as the resist solution is uniformly applied onto the second principal surface, example of which include spin coating, spray coating, and slit coating. The spin coating is performed using a spin coater. The spray coating is performed using a spray coater. The slit coating is performed using a slit coater.

Next, the resist film is patterned, to selectively cover the first region with the resist film. The patterning includes an exposure step of exposing the resist film to light in a pattern corresponding to the location of the first region, and a development step of removing the resist film covering other than the first region, with a developing solution. The patterning may further include a washing step of washing away the remaining developing solution, with pure water or the like. In the light exposure step, the resist film is exposed to, for example, UV light, thereby to vary the solubility of the resist film in the developing solution. The development step may be performed using a developing solution and a developing system (development by dipping or spraying) suited to the characteristics of the resist film. Preferably, the exposure conditions and the development conditions are adjusted so that the patterned resist film has a cross section of a reverse tapered shape. When the patterned resist film has a reverse tapered cross section, in a metal film formation step as described later, a metal film is unlikely to be formed on the side surface of the patterned resist film. This makes it easy to expose the semiconductor layer corresponding to the first region in the first exposure step as described later.

(First Region)

The first region is determined, for example, from the position of a cut, such as an orientation flat or notch, provided on the semiconductor substrate, or from the position of a cut, such as a corner cut or notch, provided on the frame, with reference to design information, such as a design drawing. The design information shows the positional relationship between each cut and the alignment mark. A part of the second principal surface which is corresponding to the alignment mark determined from the position of the cut is referred to as the first region. In other words, at least part of the alignment mark and at least part of the first region face each other, and when seen from the direction normal to the second principal surface, at least part of the alignment mark overlaps the first region.

The position of the alignment mark determined as described above with reference to design information may sometimes deviate from the actual position thereof, due to variations in the size of the substrate, variations in the formed position of the alignment mark, and others. The deviation, however, is permissible if it is about several hundred μm. Here, a relatively wide area corresponding to the alignment mark is defined as the first region on the second principal surface.

When the alignment mark is the boundary line, the first region includes part of at least two boundary lines (e.g., an intersection of grid-pattern boundary lines, part of two adjacent parallel lines). The first region as above has, for example, an arc or annular shape along the outer periphery of the semiconductor substrate. In the case of the alignment mark other than the boundary line, the whole alignment mark as seen from the direction normal to the second principal surface overlaps the first region. In this case, given that the smallest circle that surrounds the alignment mark other than the boundary line is drawn, a circular or rectangular area overlapping the circle and having a diameter (or a longitudinal side length) about 5 to 10 times as large as that of the circle can be determined as the first region.

The first region is preferably determined such that the metal film formed in the metal film formation step does not enter the field of view of the camera used in the calculation step. This is to avoid misidentifying the metal film as the alignment mark. For example, when the diameter of the above smallest circle is 100 μm, provided that the field of view of the camera is 300 μm square, the diameter of the first region (or a longitudinal side length) is about 500 μm.

Figure 5:
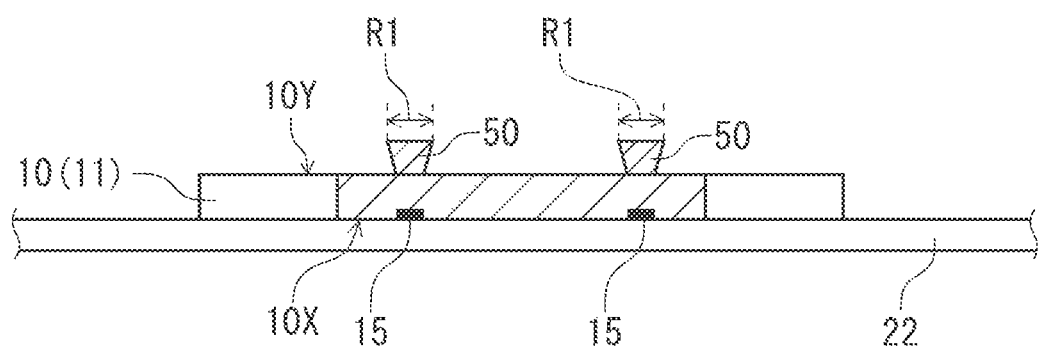
FIG. 5 is a cross-sectional view taken along the line X-X in FIG. 2A of the semiconductor substrate after a covering step according to an embodiment of the present disclosure.

FIG. 5 is a cross-sectional view taken along the line X-X in FIG. 2A of the semiconductor substrate after the covering step according to the present embodiment. A resist film 50 is formed in a first region R1 on the second principal surface 10Y of the semiconductor substrate 10. The resist film 50 is narrowed in width from the front surface side (the side farther from the second principal surface 10Y) toward the back surface side (the side closer to the second principal surface 10Y). With such a reverse tapered shape, a metal film 30 formed on the second principal surface 10Y and that on the resist film 50 in the subsequent metal formation step tend to be separated from each other.

(5) Metal Film Formation Step (S5)

After the coating step, a metal film is formed on the second principal surface of the semiconductor substrate.

The metal film is formed, for example, for allowing current to flow in the thickness direction, and improving heat dissipation. The metal film is disposed adjacent to the semiconductor layer, but not limited thereto, another layer, such as an adhesive layer, may be interposed therebetween. Examples of the material of the metal film include silver, copper, aluminum, an aluminum alloy, tungsten, nickel, gold, platinum, and titanium. The metal film is formed by, for example, vapor deposition, sputtering, or plating. The metal film may be a single layer film, and may be a multilayer film. The metal film may be, for example, obtained by laminating titanium, nickel and gold in this order on the semiconductor layer (Au/Ni/Ti), or laminating titanium, nickel and silver in this order on the semiconductor layer (Ag/Ni/Ti), or laminating titanium, nickel and aluminum alloy in this order on the semiconductor layer (Al alloy/Ni/Ti).

The thickness of the metal film (total thickness) is not limited and may be set as appropriate according to the use of the element chips. The thickness of the metal film is, for example, 50 nm or more and 100 μm or less. When the metal film is a laminate of Au/Ni/Ti, for example, the Au film thickness is 50 nm or more and 200 nm or less, the Ni film thickness is 200 nm or more and 400 nm or less, and the Ti film thickness is 100 nm or more and 300 nm or less. When the metal film is a laminate of Ag/Ni/Ti, for example, the Ag film thickness is 200 nm or more and 30 μm or less, the Ni film thickness is 200 nm or more and 400 nm or less, and the Ti film thickness is 100 nm or more and 300 nm or less. When the metal film is a laminate of Al alloy/Ni/Ti, for example, the Al-alloy film thickness is 200 nm or more and 30 μm or less, the Ni film thickness is 200 nm or more and 400 nm or less, and the Ti film thickness is 100 nm or more and 300 nm or less.

Figure 6:
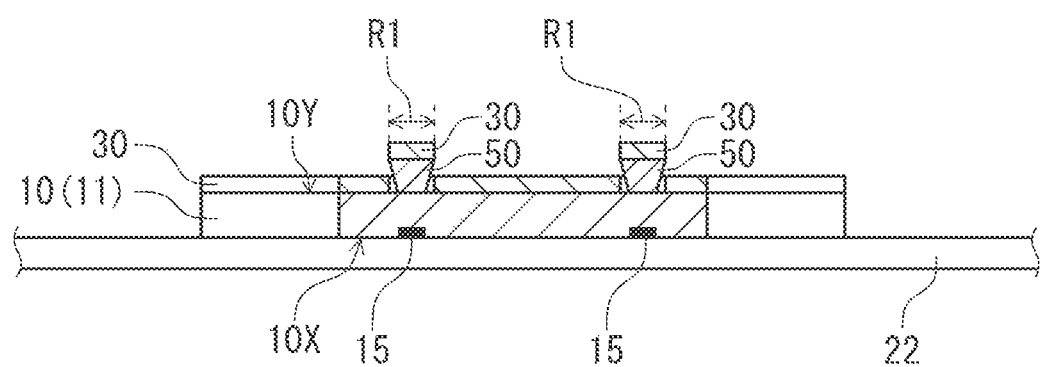
FIG. 6 is a cross-sectional view taken along the line X-X in FIG. 2A of the semiconductor substrate after a metal film formation step according to an embodiment of the present disclosure.

FIG. 6 is a cross-sectional view taken along the line X-X in FIG. 2A of the semiconductor substrate after a metal film formation step according to an embodiment of the present disclosure. The metal film 30 is formed on the second principal surface 10Y of the semiconductor substrate 10, except for the first region R1. The metal film 30 is also formed on the resist film 50. The metal film 30 on the second main surface 10Y and the metal film 30 on the resist film 50 are separated from each other. Without limited thereto, the metal film 30 may be continuously formed.

(6) First Exposure Step (S6)

After the metal film formation step, the resist film and the metal film thereon are removed (lifted off), to expose the semiconductor layer corresponding to the first region.

In the first exposure step, the resist film and the metal film thereon may be removed by bringing the semiconductor substrate into contact with a solution (developing solution) that dissolves the resist film. The solution that dissolves the resist film may be of any kind.

Figure 7A:
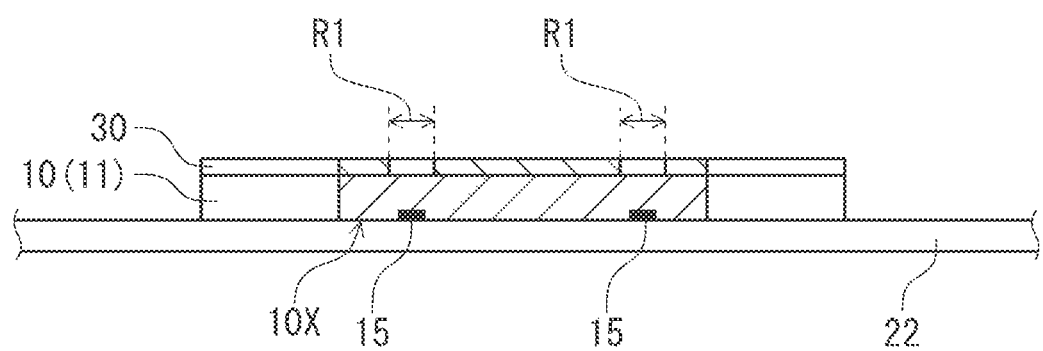
FIGS. 7A and 7B are a cross-sectional view taken along the line X-X in FIG. 2A and a schematic top view, respectively, of the semiconductor substrate after a first exposure step according to an embodiment of the present disclosure.
Figure 7B:
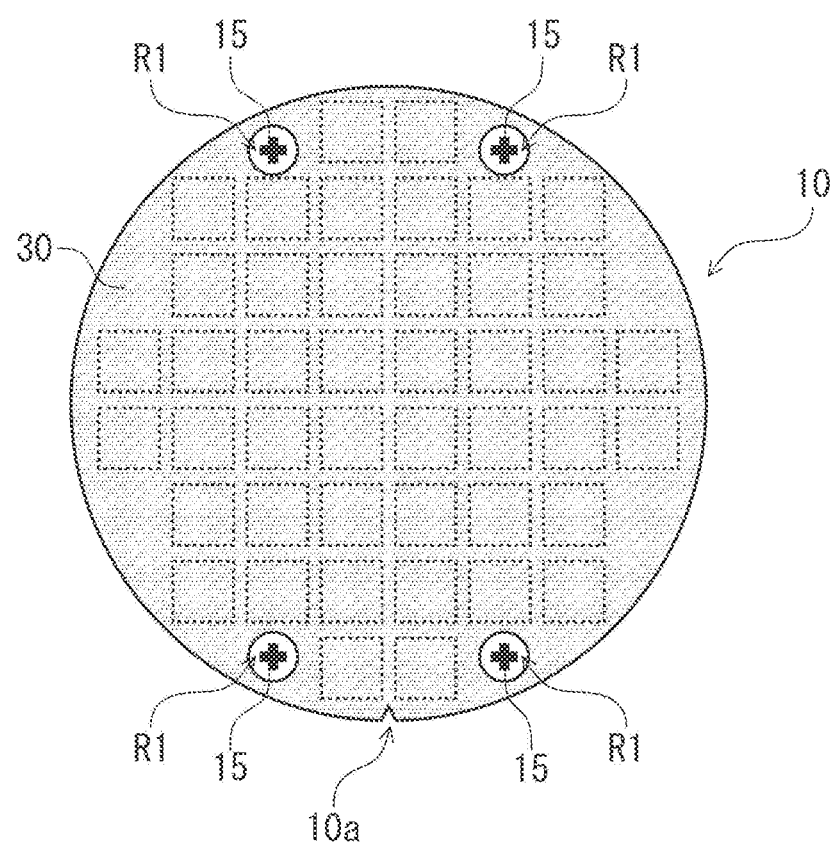

FIG. 7A is a cross-sectional view taken along the line X-X in FIG. 2A of the semiconductor substrate after the first exposure step according to the present embodiment. FIG. 7B is a schematic top view of the semiconductor substrate after the first exposure step according to the present embodiment. Four alignment marks 15 are provided on the first principal surface 10X of the semiconductor substrate 10. The resist film 50 and the metal film 30 corresponding to the first region R1 are removed at four places, so that each alignment mark 15 becomes entirely exposed. The first region R1 is a circular region surrounding each alignment mark 15. In FIG. 7B, the metal film 30 is shown by hatching for the sake of convenience.

(7) Protective Film Formation Step (S7)

Prior to the second exposure step (in this example, before the calculation step), a protective film covering the surface of the metal film is formed. In the dicing step, the protective film serves to protect the metal film corresponding to the element regions from plasma used in the dicing step and debris generated in the dicing step. The protective film corresponding to the second region is removed together with the metal film in the second exposure step.

(Protective Film)

The protective film includes, for example, a thermosetting resin such as polyimide, a resist material such as photoresist, or a water-soluble resin such as acrylic resin. The protective film can be formed by, for example, applying a liquid raw material of the protective film onto the second principal surface using a spin-coating or spray-coating technique. In particular, a water-soluble resin is preferred because it can be removed by washing with water. Examples of the water-soluble resin include polyvinyl alcohol, polyacrylamide, polyvinylpyrrolidone, 2-acrylamide-2-methylpropanesulfonic acid, sodium polyacrylate, sodium polystyrene sulfonate, lithium polystyrene sulfonate, and diallyl dimethylammonium chloride.

The protective film may have any thickness, but is preferably thick enough not to be completely removed in the plasma dicing step. The thickness of the protective film is set, for example, to be equal to or greater than a calculated amount (thickness) of the protective film to be etched in the plasma dicing step.

The protective film allows electromagnetic waves passing through the semiconductor layer to be transmitted therethrough. Therefore, even when the protective film is formed in the first region where the semiconductor layer is exposed, the protective film will not be an obstacle to the imaging of the alignment mark with the camera used in the calculation step.

Figure 8:
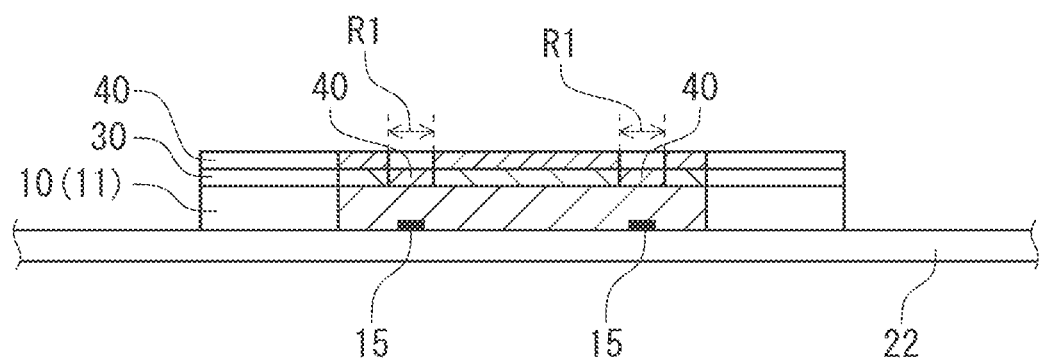
FIG. 8 is a cross-sectional view taken along the line X-X in FIG. 2A of the semiconductor substrate after a protective film formation step according to an embodiment of the present disclosure.

FIG. 8 is a cross-sectional view taken along the line X-X in FIG. 2A of the semiconductor substrate after the protective film formation step according to the present embodiment. A protective film 40 is formed so as to the cover metal film 30 on the semiconductor substrate 10.

(8) Calculation Step (S8)

The semiconductor substrate is imaged from the surface side of the metal film with a camera capable of sensing electromagnetic waves passing through the semiconductor layer, to detect the position, shape, etc. of the alignment mark through the semiconductor layer corresponding to the first region. A second region that corresponds to the dicing regions on the surface of the metal film is calculated, based on the detected data related to the alignment mark.

(Camera)

The camera is capable of sensing electromagnetic waves passing through the semiconductor layer. It is therefore possible to image the alignment mark through the semiconductor layer corresponding to the first region from the surface side of the metal film. The electromagnetic waves that pass through the semiconductor layer may be generated by, for example, a near-infrared halogen lamp arranged on the surface side of the metal film and having a peak wavelength of 1000 nm or more.

The camera may be, for example, an infrared camera capable of sensing electromagnetic waves in the near-infrared region (wavelength range: 750 nm to 1200 nm), but is preferably an infrared camera having a sensitivity in a longer wavelength region. The infrared camera constitutes an imaging unit in a laser irradiator as described below. The imaging unit may include a camera other than the infrared camera (e.g., a camera capable of sensing visible light). The imaging unit may include a plurality of infrared cameras. The field of view of the infrared camera is not limited, but may be 300 μm square or more, in view of improving the precision.

(Laser Irradiator)

The laser irradiator includes: for example, an arm for delivering a semiconductor substrate; a stage for supporting the semiconductor substrate; an irradiation head for irradiating a laser beam; a driving unit for driving the stage; an input unit for receiving input data related to the dicing regions, the first region and/or the alignment mark; an imaging unit for imaging the semiconductor substrate supported on the stage; an image processing unit for detecting the shape etc. of the imaged semiconductor substrate; an arithmetic unit for determining the position of the semiconductor substrate, the first region and/or the second region, based on the input data and the shape etc. of the semiconductor substrate detected by the image processing unit; and a control unit for controlling these operations.

The input unit includes, for example, a touch panel. Various data can be into the input unit, for example, by the operator. The control unit, the image processing unit and the arithmetic unit include, for example, a computer. The imaging unit includes a camera. The driving unit includes, for example, a ball screw and a linear guide system. The rotation of the ball screw moves the stage translationally and/or vertically under the irradiation head and the camera.

(Second Region)

The second region is calculated from the detected position of the alignment mark and the data in the input unit. The second region is part of the surface of the metal film corresponding to the dicing regions. In other words, at least part of the dicing regions and at least part of the second region face each other, and when seen from the direction normal to the surface of the metal film, at least the part of the dicing regions overlaps the second region.

Preferably, the dicing regions entirely overlap the second region.

Figure 9:
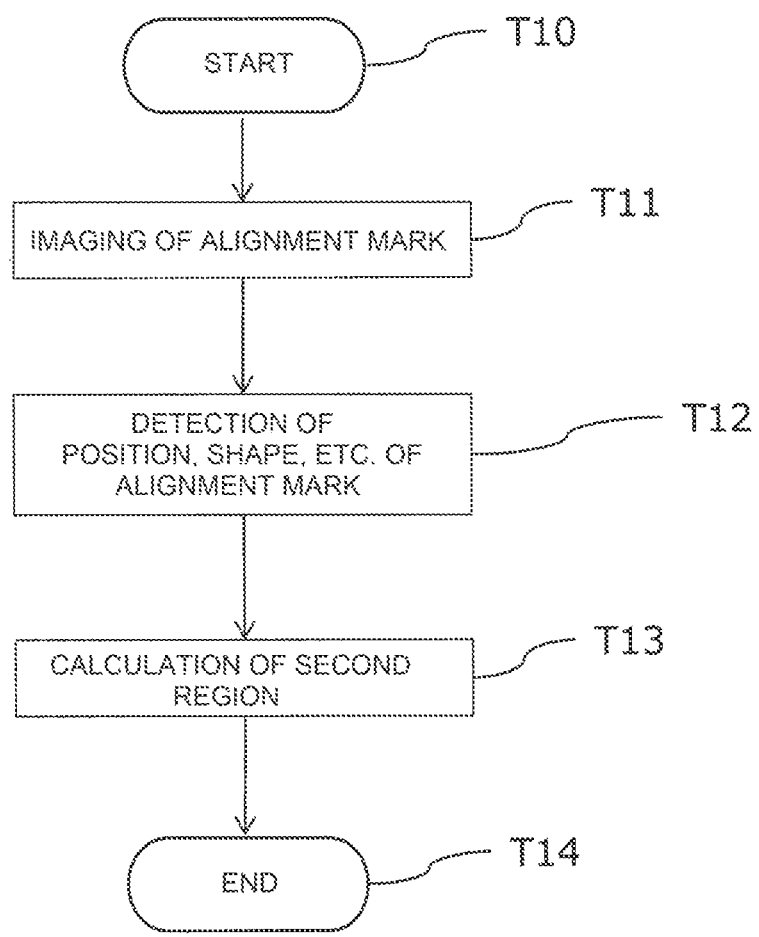
FIG. 9 is a flowchart of an operation of the laser irradiator in a calculation step according to an embodiment of the present disclosure.

FIG. 9 is a flowchart of an operation of a laser irradiator in the calculation step according to the present embodiment.

Upon completion of the protective film formation step, the operation of the laser irradiator in the calculation step starts (T10). The driving unit drives the stage, to move the first region under the infrared camera. The imaging unit captures an image of the alignment mark through the semiconductor layer corresponding to the first region, from the surface side of the metal film side, with the infrared camera (T11). The image processing unit processes the captured image, to detect the position, shape, etc. of the alignment mark (T12). The arithmetic unit calculates the position of the dicing regions on the surface of the metal film, based on the detected data related to the alignment mark and the input data related to the dicing regions (T13). This determines the second region that corresponds to the dicing regions on the surface of the metal film. Thereafter, the operation of the laser irradiator in the calculation step ends (T14).

Figure 10:
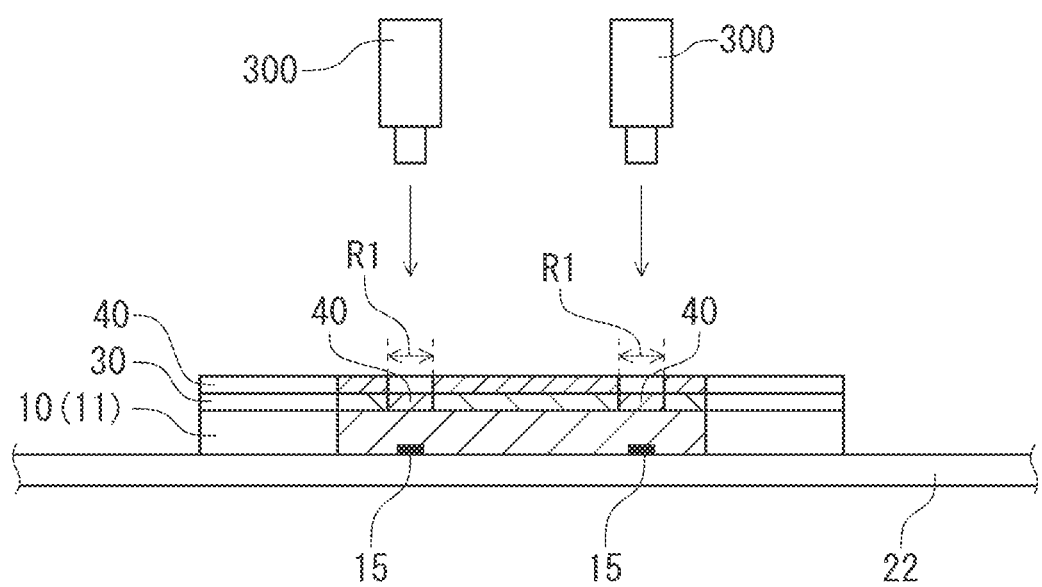
FIG. 10 is a cross-sectional view taken along the line X-X in FIG. 2A of the semiconductor substrate during the calculation step according to the embodiment of the present disclosure.

FIG. 10 is a cross-sectional view taken along the line X-X in FIG. 2A of the semiconductor substrate during the calculation step according to the present embodiment. An infrared camera 300 captures an image of the alignment mark 15 through the semiconductor layer 11 corresponding to the first region R1. The captured image is processed, and the shape etc. of the alignment mark 15 are detected. Based on the detected shape etc. of the alignment mark 15, the position of the dicing regions is calculated.

(9) Second Exposure Step (S9)

A first laser beam is irradiated to the second region from the surface side of the metal film, to remove the protective film and the metal film corresponding to the second region. As a result, the semiconductor layer corresponding to the second region is exposed.

The driving unit drives the stage, to move the end of semiconductor substrate under the irradiation head. When the semiconductor substrate is placed at a predetermined position, the irradiation unit starts irradiation of the first laser beam to the second region. Under irradiation of the first laser beam, the driving unit further drives the stage to move in the plane direction, based on the size, shape, etc. of the second region. This removes the protective film and the metal film corresponding to the second region.

(First Laser Beam)

The first laser beam preferably passes through the semiconductor layer, while being absorbed into the metal film. In this case, the metal film can be removed by the irradiation of the first laser beam, whereas in the semiconductor layer underlying the metal film, the surface is unlikely to be roughened, and the interior crystal structure is unlikely to be disordered by the irradiation.

In view of suppressing the damage to the semiconductor layer, the first laser beam is preferably to have a wavelength hardly absorbed into the semiconductor constituting the semiconductor layer. For example, when the semiconductor layer is a silicon layer, the first laser beam preferably has a wavelength of 1100 nm or more and 6 μm or less, and may be, for example, a carbon monoxide laser. The wavelength of the first laser beam is not limited to of the above wavelength range, and may be of a shorter wavelength range, which advantageously has excellent light-collecting ability. Specifically, the first laser beam may have a wavelength of 850 nm or more and 1100 nm or less, and may have a wavelength of 190 nm or more and 450 nm or less. More specifically, the wavelength of the first laser beam may be 980 nm, 1064 nm, or 1030 nm in the near infrared region, or may be 355 nm, 305 nm, 308 nm, or 266 nm in the ultraviolet region.

The first laser beam may have any frequency; the frequency is, for example, 1 kHz or more and 200 kHz or less.

The first laser beam may be emitted by any laser oscillation mechanism. Examples of the first laser include: a semiconductor laser using a semiconductor as a laser oscillation medium; a gas laser using a gas, such as carbon dioxide ($CO_2$), as the medium; a solid laser using YAG; and a fiber laser. Any laser oscillator may be used for laser emission. Preferred is a pulse laser oscillator that emits a pulse laser beam, in terms of its low thermal impact on the semiconductor substrate.

The laser beam may have any pulse width. In view of reducing the thermal impact and preventing the damage to the semiconductor layer, the pulse width is preferably 500 nanoseconds or less, more preferably 200 nanoseconds or less. Particularly preferred is an ultrashort pulse laser beam having a pulse width ranging from several femtoseconds ($1 \cdot 10^{-15}$ sec) or several hundred femtoseconds ($100 \cdot 10^{-15}$ sec) to 100 picoseconds ($100 \cdot 10^{-12}$ sec).

After the second exposure step, a second laser beam may be irradiated to the exposed semiconductor layer, to improve the smoothness of the semiconductor layer. The second laser beam may be, for example, a long pulse laser beam having a pulse width of several hundred nanoseconds to several milliseconds, and may be a laser beam shaped to have an intensity distribution in the plane orthogonal to the optical axis being a flat top distribution (top hat distribution).

Figure 11A:
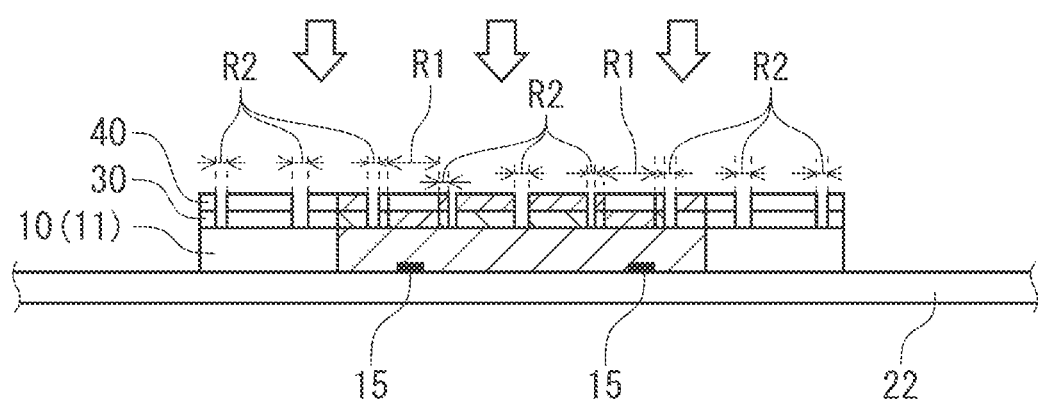
FIGS. 11A and 11B are a cross-sectional view taken along the line X-X in FIG. 2A and a schematic top view, respectively, of the semiconductor substrate after a second exposure step according to an embodiment of the present disclosure.
Figure 11B:
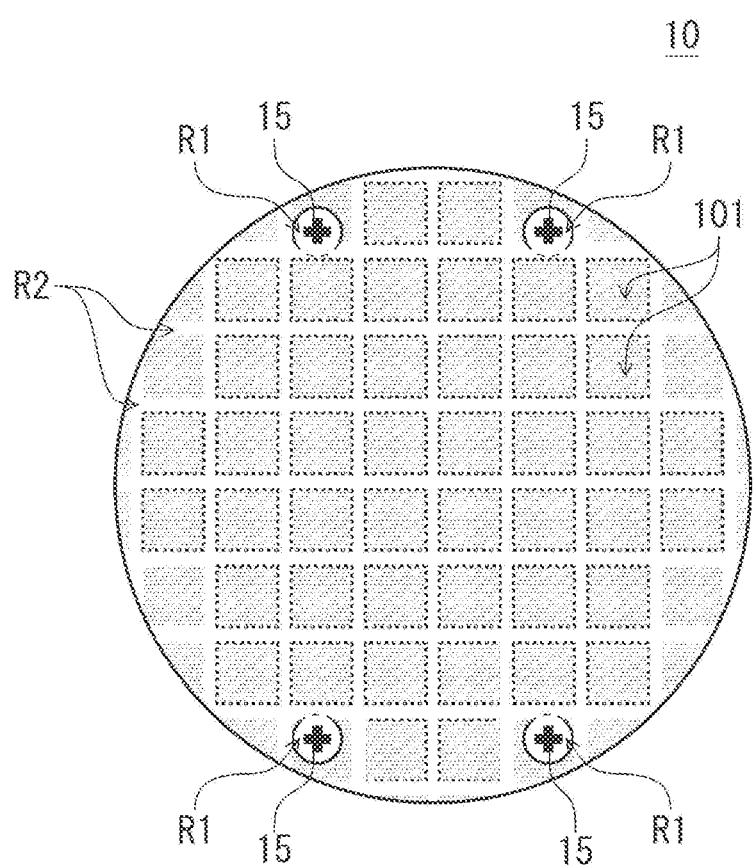

FIG. 11A is a cross-sectional view taken along the line X-X in FIG. 2A of the semiconductor substrate after the second exposure step according to the present embodiment. FIG. 11B is a schematic top view of the semiconductor substrate after the second exposure step according to the present embodiment. The protective film 40 and the metal film 30 corresponding to a second region R2 are removed, and the semiconductor layer 11 corresponding to the second region R2 is exposed. In FIG. 11B, the protective film 40 is shown by hatching for the sake of convenience.

(10) Dicing Step (S10)

The exposed semiconductor layer corresponding to the second region is removed, so that the semiconductor substrate is diced into a plurality of element chips. The dicing step can be performed by applying a plasma (first plasma) to the second region from the surface side of the metal film.

Figure 12:
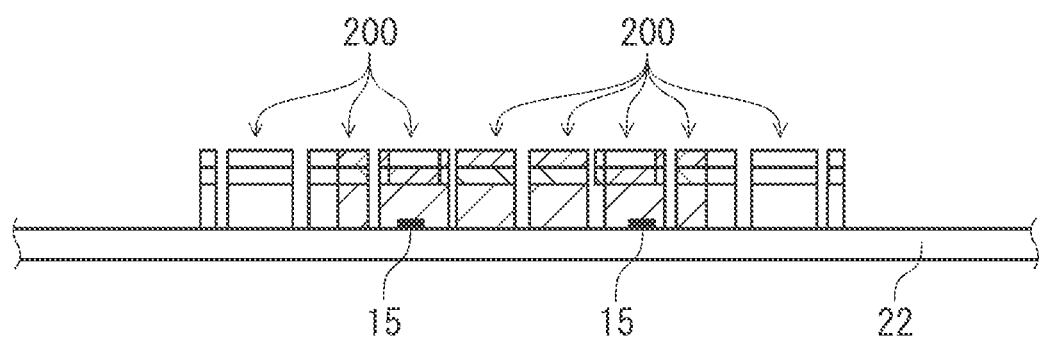
FIG. 12 is a cross-sectional view taken along the line X-X in FIG. 2A of the semiconductor substrate (element chips) after a dicing step according to an embodiment of the present disclosure.

FIG. 12 is a cross-sectional view taken along the line X-X in FIG. 2A of the semiconductor substrate after the dicing step according to the present embodiment. The semiconductor layer 11 corresponding to the second region R2 is removed, forming a plurality of element chips 200.

Prior to the dicing step, a step of cleaning the surface of the metal film with a second plasma may be performed. The second plasma is usually generated under the conditions different from those for generating the first plasma when performing dicing. The cleaning step is performed for the purpose of, for example, reducing the residue caused by the second exposure step. This can improve the quality of the plasma dicing.

Figure 13:
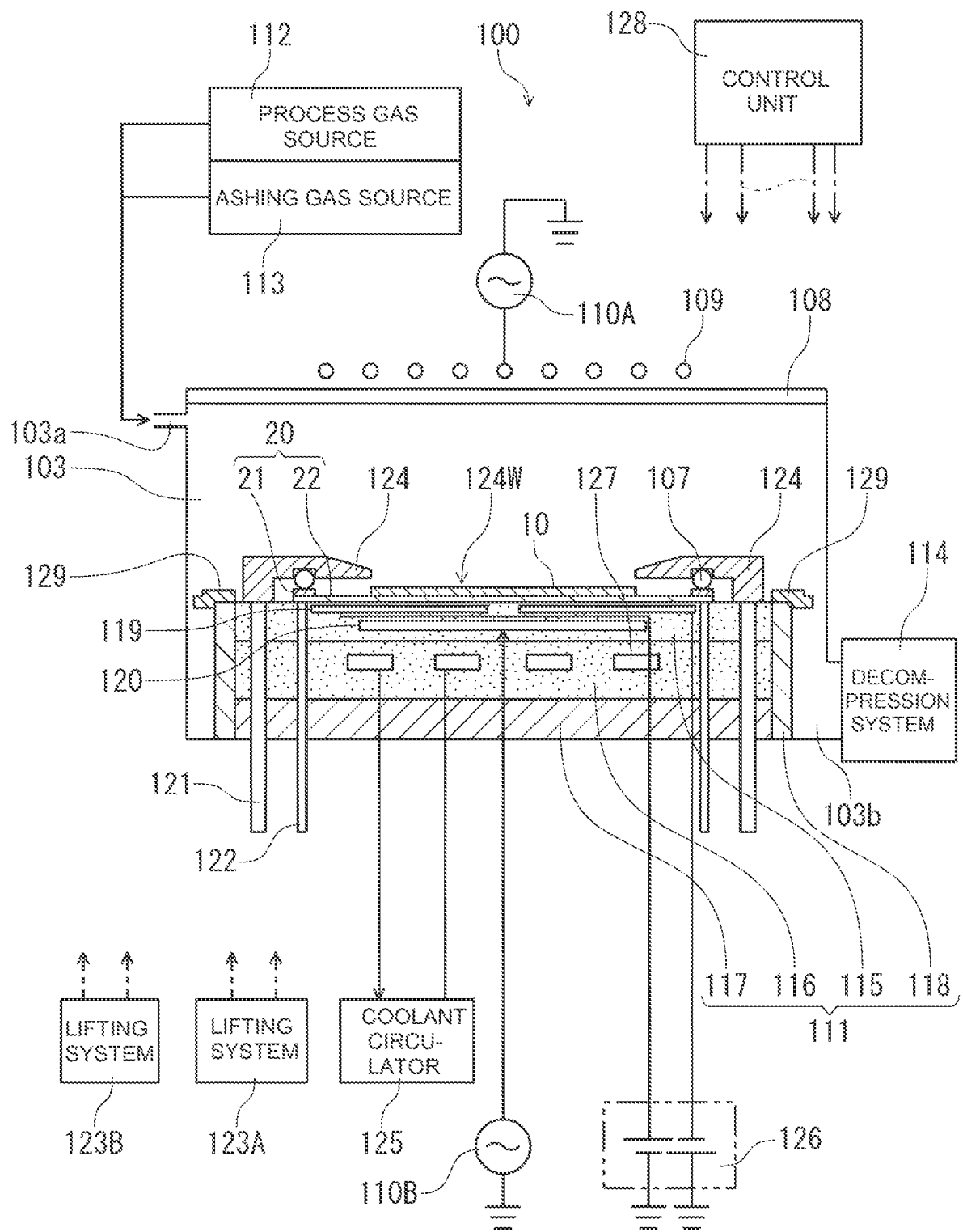
FIG. 13 is a schematic cross-sectional diagram of a plasma processing apparatus.

Next, an embodiment of a plasma processing apparatus used in the dicing step will be specifically described. FIG. 13 is a schematic cross-sectional diagram of a plasma processing apparatus. In FIG. 13, the semiconductor substrate is held on the conveying carrier. The structure of the plasma processing apparatus is not limited thereto.

(Plasma Processing Apparatus)

A plasma processing apparatus 100 includes a stage 111. A conveying carrier 20 is set on the stage 111, with the surface holding a semiconductor substrate 10 of a holding sheet 22 faced upward. The stage 111 has such a size that the whole conveying carrier 20 can be seated thereon. Above the stage 111, a cover 124 having a window 124W for exposing at least part of the semiconductor substrate 10 therefrom is arranged. The cover 124 is provided with pressing members 107 for pressing the frame 21 downward while the frame 21 is on the stage 111. The pressing members 107 are preferably a member that can achieve point contact with the frame 21 (e.g., a coil spring or an elastic resin). This can correct the distortion of the frame 21, while restricting the thermal communication between the frame 21 and the cover 124.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103$a$ and a gas outlet 103$b$. The gas inlet 103$a$ is connected to plasma-generating gas (process gas) supply sources, i.e., a process gas source 112 and an ashing gas source 113, each through a conduit. The gas outlet 103$b$ is connected to a decompression system 114 including a vacuum pump for exhausting the gas within the vacuum chamber 103 to reduce the pressure therein. While a process gas is introduced into the vacuum chamber 103, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as listed above.

Within the electrode layer 115, an electrode for electrostatic chucking (hereinafter, ESC electrode 119), and a second electrode 120 electrically connected to a second high-frequency power source 110B are disposed. The ESC electrode 119 is electrically connected to a DC power source 126. The ESC electrode 119 and the DC power source 126 constitute an electrostatic chuck system. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with an anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the semiconductor substrate 10 and the holding sheet 22 from being damaged by being heated during plasma processing. A coolant in the coolant channel 127 is circulated by a coolant circulator 125.

Around the peripheral portion of the stage 111, a plurality of support members 122 extending through the stage 111 are provided. The support members 122 support the frame 21 of the conveying carrier 20. The support members 122 are driven by a first lifting system 123A, and move upward and downward. The conveying carrier 20 having delivered into the vacuum chamber 103 is passed onto the support members 122 at a predetermined raised position. Then the support members 122 descend until their top surfaces become flush with or lower than the top surface of the stage 111, which sets the conveying carrier 20 at a predetermined position on the stage 111.

A plurality of lifting rods 121 are coupled to the peripheral edge of the cover 124, to lift and lower the cover 124. The lifting rods 121 are driven by a second lifting system 123B. The lifting and lowering operation of the cover 124 by the second lifting systems 123B can be controlled independently from the operation by the first lifting system 123A.

Figure 14:
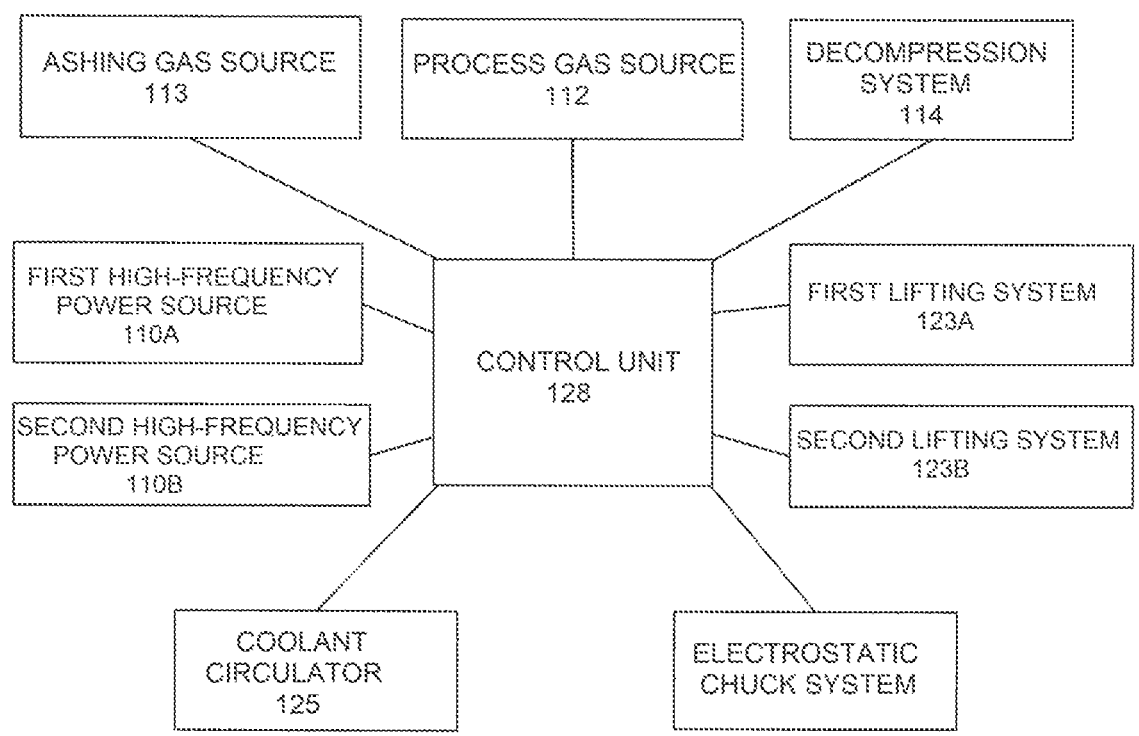
FIG. 14 is a block diagram of the plasma processing apparatus used in an embodiment of the present disclosure.

A control unit 128 is configured to control operations of component elements of the plasma processing appratus 100 including the first high-frequency power source 110A, the second high-frequency power source 110B, the process gas source 112, the ashing gas source 113, the decompression system 114, the coolant circulator 125, the first and second lifting systems 123A and 123B, and the electrostatic chuck system. FIG. 14 is a block diagram of the plasma processing apparatus used in the present embodiment.

After the conveying carrier 20 holding the semiconductor substrate 10 is delivered into the vacuum chamber 103, the semiconductor substrate 10 is subjected to etching while being seated on the stage 111. In delivering the semiconductor substrate 10, within the vacuum chamber 103, the cover 124 is lifted to a predetermined position by means of the lifting rods 121. A gate valve (not shown) opens to allow the conveying carrier 20 to be delivered into the vacuum chamber 103. The support members 122 are on standby at a raised position. When the conveying carrier 20 reaches a predetermined position above the stage 111, the conveying carrier 20 is passed onto the support members 122. The conveying carrier 20 is placed onto the support members 122, with the adhesive side 22X of the holding sheet 22 faced upward.

After the conveying carrier 20 is passed onto the support members 122, the vacuum chamber 103 is closed in a hermetically sealed state. Next, the support members 122 start descending. When the support members 122 have descended until their top surfaces become flush with or lower than the top surface of the stage 111, the conveying carrier 20 is set on the stage 111. Then the lifting rods 121 are driven to lower the cover 124 to a predetermined position. The distance between the cover 124 and the stage 111 is adjusted so that the pressing members 107 in the cover 124 each come in point-contact with the frame 21. In this way, the frame 21 is pressed downward by the pressing members 107 and is covered with the cover 124, with at least part of the semiconductor substrate 10 exposed from the window 124W.

The cover 124 has, for example, a doughnut-like shape with approximately circular contour and has a consistent width and thin thickness. The diameter of the window 124W is smaller than the inner diameter of the frame 21, and the outer diameter thereof is greater than the outer diameter of the frame 21. Therefore, when the cover 124 is lowered while the conveying carrier 20 is set on the stage 111 at a predetermined position, the cover 124 can cover the frame 21, with at least part of the semiconductor substrate 10 exposed from the window 124W.

The cover 124 is formed of, for example, a dielectric such as ceramics (e.g., alumina, aluminum nitride) or quarts, or a metal such as aluminum or aluminum with an anodic oxidation coating. The pressing members 107 can be formed of the aforementioned dielectric or metal, or a resin material.

After the conveying carrier 20 is passed onto the support members 122, a voltage is applied to the ESC electrode 119 from the DC power source 126. By doing this, the holding sheet 22 is brought into contact with the stage 111 and concurrently, is electrostatically chucked on the stage 111. The voltage application to the ESC electrode 119 may be initiated after the holding sheet 22 is set on (or comes in contact with) the stage 111.

Upon completion of etching, the gas in the vacuum chamber 103 is evacuated, and the gate valve opens. The conveying carrier 20 holding a plurality of element chips 200 is delivered out of the plasma processing apparatus 100 by means of a conveying system having entered through the gate valve. After the conveying carrier 20 is delivered out, the gate valve is immediately closed. The conveying carrier 20 may be delivered out by performing the above-mentioned procedures of setting the conveying carrier 20 on the stage 111 in the reverse order. Specifically, after the cover 124 is lifted to a predetermined position, the voltage applied to the ESC electrode 119 is cut off, to release the chucking of the conveying carrier 20 to the stage 111. Then, the support members 122 are raised. After the support members 122 reach a predetermined raised position, the conveying carrier 20 is delivered out of the vacuum chamber 103.

The conditions for generating a plasma (first plasma) used for etching the semiconductor layer may be set according to the material of the semiconductor layer and other factors.

The semiconductor layer is plasma-etched by, for example, a Bosch process. In the Bosch process, the semiconductor layer is etched vertically in the depth direction. When the semiconductor layer contains Si, the Bosch process repeats a film deposition step, a deposited-film etching step, and a Si etching step in this order, thereby to dig the semiconductor layer in the depth direction.

The film deposition step is carried out, for example, under the following conditions: while $C_4F_8$ is introduced as a process gas at a rate of 150 sccm or more and 250 sccm or less, the pressure in the vacuum chamber is controlled to 15 Pa or more and 25 Pa or less, with the input power to the first electrode from the first high-frequency source set at 1500 W or more and 2500 W or less, and the input power to the second electrode from the second high-frequency power source set at 0 W or more and 50 W or less; the processing time is 2 seconds or more and 15 seconds or less.

The deposited-film etching step is carried out, for example, under the following conditions: while $SF_6$ is introduced as a process gas at a rate of 200 sccm or more and 400 sccm or less, the pressure in the vacuum chamber is controlled to 5 Pa or more and 15 Pa or less, with the input power to the first electrode from the first high-frequency power source set at 1500 W or more and 2500 W or less, and the input power to the second electrode from the second high-frequency power source set at 300 W or more and 1000 W or less; the processing time is 2 seconds or more and 10 seconds or less.

The Si etching step is carried out, for example, under the following conditions: while $SF_6$ is introduced as a process gas at a rate of 200 sccm or more and 400 sccm or less, the pressure in the vacuum chamber is controlled to 5 Pa or more and 15 Pa or less, with the input power to the first electrode from the first high-frequency power source set at 1500 W or more and 2500 W or less, the input power to the second electrode from the second high-frequency power source set at 50 W or more and 500 W or less; the processing time is 10 seconds or more and 20 seconds or less.

By repeating the film deposition step, the deposited-film etching step, and the Si etching step under the conditions as above, the semiconductor layer containing Si can be etched vertically in the depth direction at a rate of 10 μm/min or more and 20 μm/min or less.

Although in the foregoing, a description is made on the element chip manufacturing method including a dicing step, a substrate processing method including an etching step, in place of the dicing step, is also encompassed in the present embodiment. In the etching step of the substrate processing method, after the second exposure step, the exposed semiconductor layer corresponding to the second region is etched with plasma. In this etching step, the semiconductor substrate is not diced, and grooves can be formed along the dicing regions on the semiconductor substrate.

The present disclosure is applicable to an element chip manufacturing method and a substrate processing method.

REFERENCE NUMERALS

10: semiconductor substrate
  10a: notch
  10X: first principal surface
  10Y: second principal surface
  101: element region
  102: dicing region
11: semiconductor layer
15: alignment mark
R1: first region
R2: second region
20: conveying carrier
  21: frame
    21a: notch
    21b: corner cut
  22: holding sheet
  22X: adhesive side
  22Y: non-adhesive side
30: metal film
40: protective film
50: resist film
100: plasma processing apparatus
  103: vacuum chamber
    103a: gas inlet
    103b: gas outlet
  108: dielectric member
  109: first electrode
  110A: first high-frequency power source
  110B: second high-frequency power source
  111: stage
  112: process gas source
  113: ashing gas source
  114: decompression system
  115: electrode layer
  116: metal layer
  117: base table
  118: peripheral member
  119: ESC electrode 120: second electrode
121: lifting rod
122: support member
123A: first lifting system
123B: second lifting system
124: cover
  124W: window
125: coolant circulator
126: DC power source
127: coolant channel
128: control unit
129: circumferential ring
200: element chip
300: infrared camera

What is claimed is:

1. An element chip manufacturing method, comprising:
a preparation step of preparing a semiconductor substrate that includes a first layer having a first principal surface provided with a plurality of element regions, a dicing region defining the element regions, and an alignment mark, and having a second principal surface opposite the first principal surface, wherein the first layer includes a semiconductor layer;
a covering step of covering a first region that corresponds to the alignment mark on the second principal surface, with a resist film;
a metal film formation step of forming a metal film on the second principal surface;
a first exposure step of removing the resist film, to expose the semiconductor layer corresponding to the first region;
a calculation step of imaging the semiconductor substrate from a surface side of the metal film, with a camera capable of sensing electromagnetic waves passing through the semiconductor layer, to detect a position of the alignment mark through the semiconductor layer corresponding to the first region, and then calculating a position of the dicing region on a surface of the metal film, to determine a second region that corresponds to the dicing region on the surface of the metal film such that at least part of the dicing region overlaps the second region when seen from a direction normal to the surface of the metal film, based on the detected position of the alignment mark and input data related to the dicing regions;
a second exposure step of irradiating a first laser beam to the second region from the surface side of the metal film, to remove the metal film corresponding to the second region and expose the semiconductor layer corresponding to the second region; and
a dicing step of removing the exposed semiconductor layer corresponding to the second region, after the second exposure step, to dice the semiconductor substrate into a plurality of element chips.

2. The element chip manufacturing method according to claim 1, further comprising:
a protective film formation step of forming a protective film covering the surface of the metal film, before the second exposure step, wherein in the second exposure step, the protective film corresponding to the second region is removed together with the metal film corresponding to the second region, and
in the dicing step, the semiconductor layer corresponding to the second region is removed by exposing the second region to plasma.

3. The element chip manufacturing method according to claim 1, further comprising:
an attaching step of attaching the first principal surface of the semiconductor substrate onto a holding sheet, before the dicing step, wherein
the dicing step is performed while the semiconductor substrate is held by the holding sheet.

4. The element chip manufacturing method according to claim 1, further comprising: a polishing step of polishing the second principal surface of the semiconductor substrate, before the covering step.

5. The A substrate processing method, comprising:
a preparation step of preparing a semiconductor substrate that includes a first layer having a first principal surface provided with a plurality of element regions, a dicing region defining the element regions, and an alignment mark, and having a second principal surface opposite the first principal surface, wherein the first layer includes a semiconductor layer;
a covering step of covering a first region that corresponds to the alignment mark on the second principal surface, with a resist film;
a metal film formation step of forming a metal film on the second principal surface;
a first exposure step of removing the resist film, to expose the semiconductor layer corresponding to the first region;
a calculation step of imaging the semiconductor substrate from a surface side of the metal film, with a camera capable of sensing electromagnetic waves passing through the semiconductor layer, to detect a position of the alignment mark through the semiconductor layer corresponding to the first region, and then calculating a position of the dicing region on a surface of the metal film, to determine a second region that corresponds to the dicing region on the surface of the metal film such that at least part of the dicing region overlaps the second region when seen from a direction normal to the surface of the metal film, based on the detected position of the alignment mark and input data related to the dicing regions;
a second exposure step of irradiating a first laser beam to the second region from the surface side of the metal film, to remove the metal film corresponding to the second region and expose the semiconductor layer corresponding to the second region; and
an etching step of etching with plasma the exposed semiconductor layer corresponding to the second region, after the second exposure step.

* * * * *